US006492092B1

(12) United States Patent
Foster et al.

(10) Patent No.: US 6,492,092 B1
(45) Date of Patent: Dec. 10, 2002

(54) HYDROXY-EPOXIDE THERMALLY CURED UNDERCOAT FOR 193 NM LITHOGRAPHY

(75) Inventors: Patrick Foster, Providence, RI (US); Sydney George Slater, Cumberland, RI (US); Thomas Steinhäusler, Riverside, RI (US); Andrew J. Blakeney, Seekonk, MA (US); John Joseph Biafore, Providence, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 09/268,429

(22) Filed: Mar. 12, 1999

(51) Int. Cl.$^7$ ................. G03F 7/11; G03F 7/26
(52) U.S. Cl. ............ 430/271.1; 430/325; 430/326; 525/118
(58) Field of Search .............. 525/118; 430/271.1, 430/325, 326

(56) References Cited

U.S. PATENT DOCUMENTS

| | | | | |
|---|---|---|---|---|
| 3,245,954 A | * | 4/1966 | Bergman et al. ............ 568/308 |
| 3,884,992 A | * | 5/1975 | Shimizu et al. .......... 260/837 R |
| 3,912,773 A | | 10/1975 | Havriliak .................. 260/42.28 |
| 4,072,770 A | | 2/1978 | Ting ............................ 427/54 |
| 4,407,927 A | | 10/1983 | Kamoshida et al. ......... 430/197 |
| 4,481,049 A | * | 11/1984 | Reichmanis et al. ......... 430/313 |
| 4,593,052 A | * | 6/1986 | Irving ........................ 522/31 |
| 4,800,152 A | | 1/1989 | Allen et al. ............... 430/270.1 |
| 4,866,133 A | * | 9/1989 | Andrews et al. ............. 525/109 |
| 4,980,268 A | | 12/1990 | Bartmann et al. ......... 430/283.1 |
| 5,218,018 A | * | 6/1993 | Tominaga et al. ........... 423/412 |
| 5,242,980 A | | 9/1993 | Tse ........................... 525/114 |
| 5,286,599 A | | 2/1994 | Babich et al. ............ 430/270.1 |
| 5,397,685 A | * | 3/1995 | Daniels et al. .............. 430/325 |
| 5,492,793 A | | 2/1996 | Breyta et al. ........... 430/270.14 |
| 5,547,812 A | | 8/1996 | Collins et al. ............ 430/270.1 |
| 5,597,868 A | * | 1/1997 | Kunz ......................... 525/154 |
| 5,618,892 A | | 4/1997 | Furihata et al. ............. 525/483 |
| 5,635,332 A | | 6/1997 | Nakano et al. .......... 430/270.1 |
| 5,658,706 A | | 8/1997 | Niki et al. ............... 430/270.1 |
| 5,660,969 A | | 8/1997 | Kaimoto .................. 430/270.1 |
| 5,665,518 A | | 9/1997 | Maeda et al. ............ 430/270.1 |
| 5,691,111 A | | 11/1997 | Iwasa et al. .............. 430/270.1 |
| 5,695,910 A | | 12/1997 | Urano et al. ............. 430/270.1 |
| 5,700,624 A | | 12/1997 | Thackeray et al. ....... 430/270.1 |
| 5,707,776 A | | 1/1998 | Kawabe et al. .......... 430/270.1 |
| 5,731,125 A | | 3/1998 | Yamachika et al. ....... 430/270.1 |
| 5,736,296 A | | 4/1998 | Sato et al. ............... 430/270.1 |
| 5,738,975 A | | 4/1998 | Nakano et al. ........... 430/280.1 |
| 5,744,281 A | | 4/1998 | Niki et al. ............... 430/270.1 |
| 5,750,309 A | | 5/1998 | Hatakeyama et al. ....... 430/170 |
| 5,759,739 A | | 6/1998 | Takemura et al. ........ 430/270.1 |
| 5,773,191 A | | 6/1998 | Padmanaban et al. ... 430/270.1 |
| 6,054,248 A | * | 4/2000 | Foster et al. ............. 430/271.1 |
| 6,114,085 A | * | 9/2000 | Padmanaban et al. ... 430/270.1 |

* cited by examiner

*Primary Examiner*—Cynthia Hamilton
(74) *Attorney, Agent, or Firm*—Ohlandt, Greeley, Ruggiero & Perle, L.L.P.

(57) ABSTRACT

The present invention is directed to a thermally curable polymer composition comprising a hydroxyl-containing polymer and a polyfunctional epoxide as a crosslinking agent. The thermally curable polymer composition may be dissolved in a solvent and used as an undercoat layer in deep UV lithography. In addition, the present invention also relates to a photolithographic coated substrate comprising: a substrate, the thermally cured undercoat composition on the substrate, and a radiation-sensitive resist topcoat on the thermally cured undercoat composition. Furthermore, the present invention further relates to a process for using the photolithographic coated substrate for the production of relief structures.

33 Claims, No Drawings

HYDROXY-EPOXIDE THERMALLY CURED UNDERCOAT FOR 193 NM LITHOGRAPHY

FIELD OF THE INVENTION

The present invention relates to deep UV lithography used in semiconductor manufacturing and more particularly to undercoat layers for chemically amplified bilayer resist systems.

BACKGROUND TO THE INVENTION

Integrated circuit production relies on the use of photolithographic processes to define the active elements and interconnecting structures on microelectronic devices. Until recently, g-line (436 nm) and I-line (365 nm) wavelengths of light have been used for the bulk of microlithographic applications. However, in order to achieve smaller dimensions of resolution, the wavelength of light used for microlithography in semiconductor manufacturing has been reduced into the deep UV regions of 256 nm and 193 nm. The problem with using deep UV wavelengths is that resists used at the higher wavelengths were too absorbent and insensitive. Thus, in order to utilize deep UV light wavelengths, new resist materials with low optical absorption and enhanced sensitivities were needed.

Chemically amplified resist materials have recently been developed through the use of acid-labile polymers in order to meet the above-mentioned criteria. They have shown great promise in increasing resolution. However, chemically amplified resist systems have many shortcomings. One problem is standing wave effects, which occur when monochromatic deep UV light is reflected off the surface of a reflective substrate during exposure. The formation of standing waves in the resist reduces resolution and causes linewidth variations. For example, standing waves in a positive resist have a tendency to result in a foot at the resist/substrate interface reducing the resolution of the resist.

In addition, chemically amplified resist profiles and resolution may change due to substrate poisoning. Particularly, this effect occurs when the substrate has a nitride layer. It is believed that the N—H bond in the nitride film deactivates the acid at the nitride/resist interface. For a positive resist, this results in an insoluble area, and either resist scumming, or a foot at the resist/substrate interface.

Furthermore, lithographic aspect ratios require the chemically amplified resist layer be thin, e.g., about 0.5 $\mu$m, to print sub 0.18 $\mu$m features. This in turn requires the resist to have excellent plasma etch resistance such that resist image features can be transferred down into the underlying substrate. However, in order to decrease absorbance of the chemically amplified resist, aromatic groups, such as those in novolaks had to be removed, which in turn decreased the etch resistance.

Utilizing an underlayer or undercoat film that is placed on the substrate before the chemical amplified film is applied can reduce the above-mentioned problems. The undercoat absorbs most of the deep TV light attenuating standing wave effects. In addition, the undercoat prevents deactivation of the acid catalyst at the resist/substrate interface. Furthermore, the undercoat layer can contain some aromatic groups to provide etch resistance.

In the typical bilayer resist process, the undercoat layer is applied on the substrate. The chemically amplified resist is then applied on the undercoat layer, exposed to deep UV light and developed to form images in the chemically amplified resist topcoat. The bilayer resist system is then placed in an oxygen plasma etch environment to etch the undercoat in the areas where the chemically amplified resist has been removed by the development. The chemically amplified resist in a bilayer system typically contains silicon and is thus able to withstand oxygen plasma etching. After the bottom layer is etched, the resist system can be used for subsequent processing such as non-oxygen plasma etch chemistry which removes the underlying substrate.

Even though the undercoat attenuates standing waves and substrate poisoning, it poses other problems. First, some undercoat layers are soluble to the chemical amplified resist solvent component. If there is intermixing between the top and undercoat layers, the resolution and sensitivity of the top resist layer will be detrimentally affected.

In addition, if there is a large difference in the index of refraction between the chemical amplified resist and the undercoat layer, light will reflect off the undercoat layer causing standing wave effects in the resist. Thus, the index of refraction between the two layers must be matched to minimize reflectivity effects.

Another problem with undercoating layers is that they are sometimes too absorbent because of incorporation of aromatic groups. Some semiconductor manufacturing deep UV exposure tools utilize the same wavelength of light to both expose the resist and to align the exposure mask to the layer below the resist. If the undercoat layer is too absorbent, the reflected light needed for alignment is too attenuated to be useful. However, if the undercoat layer is not absorbent enough, standing waves may occur. A formulator must balance these competing objectives.

In addition, some undercoats have very poor plasma etch resistance to plasma chemistry. The etch resistance of the undercoat should be comparable to the etch rate of novolak resins in order to be commercially viable.

Furthermore, some undercoat layers require UV exposure in order to form cross-links before the radiation sensitive resist topcoat layer can be applied. The problem with UV cross-linking undercoat layers is that they require long exposure times to form sufficient cross-links. The long exposure times severely constrain throughput and add to the cost of producing integrated circuits. The UV tools also do not provide uniform exposure so that some areas of the undercoat layer may be cross-linked more than other areas of the undercoat layer. In addition, UV cross-linking exposure tools are very expensive and are not included in most resist coating tools because of expense and space limitations.

Some undercoat layers are cross-linked by heating. However, the problem with these undercoat layers is that they require high curing temperatures and long curing times before the top layer can be applied. In order to be commercially useful, undercoat layers should be curable at temperatures below 250° C. and for a time less than 180 seconds. After curing, the undercoat should have a high glass transition temperature to withstand subsequent high temperature processing.

Therefore, it is an object of the present invention to provide a thermally curable polymer composition that is useful for an undercoat layer in deep UV lithography. Another object of the present invention is to provide an undercoat layer, which is cured at temperatures less than about 250° C. and for a time less than about 3 minutes. It is a further object of this invention to provide an undercoat layer which is insoluble to the top resist's solvent system, minimizes reflectivity effects, and has an etch rate comparable to novolaks.

Other and further objects, advantages and features of the present invention shall become apparent as described below.

SUMMARY OF THE INVENTION

The present invention is directed to a thermally curable polymer composition comprising a hydroxyl-containing polymer, a polyfunctional epoxide as a crosslinking agent and, optionally, a thermal acid generator. The thermally curable polymer composition may be dissolved in a solvent and used as an undercoat layer in deep UV lithography.

In addition, the present invention also relates to a photolithographic coated substrate comprising: a substrate, a thermally cured undercoat composition on the substrate, and a radiation-sensitive resist topcoat on the thermally cured undercoat composition. Furthermore, the present invention further relates to a process for using the photolithographic coated substrate for the production of relief structures.

DESCRIPTION OF PREFERRED EMBODIMENTS

This invention relates to a thermally curable polymer composition, which may be used for forming an undercoat layer in deep UV lithography. The thermally curable polymer composition comprises a hydroxyl-containing polymer, a polyfunctional epoxide cross-linking agent and, optionally, a thermal acid generator. The molar ratio of the polyfunctional epoxide to the hydroxyl groups on the polymer is about 1:3 to 3:1, preferably about 1:2 to 2:1. When the composition is heated, the epoxide cross-links the polymer chains resulting into a thermally cured polymer matrix.

The polyfunctional epoxy cross-linking agent used in this invention may have the general formula:

wherein A is a polyfunctional group with a valence of at least 2, n is a integer of at least 2, and R is a hydrocarbyl radical. A may be aliphatic or aromatic. Aliphatic type epoxy cross-linking agents include the glycidyl ethers of polyhydroxy, polythio and polycarboxy aliphatic compounds, particularly polyglycidyl ethers of polyalcohols, such as, for example, diglycidyl ethers of terminal diols, including butanediol diglycidyl ether, hexanediol diglycidyl ether, paracyclohexyldimethanol diglycidyl ether, neopentyl glycol diglycidyl ether, triglycidyl ethers of triols, including trimethylolpropane triglycidyl ether and glycerol triglycidyl ether, and tetraglycidyl ethers of tetrols including pentaerythritol tetraglycidyl ether and the like. There may also be mentioned here epoxidized olefin compounds such as, for example, epoxidized soybean oil, epoxidized linseed oil, epoxidized cycloolefins and cyclic dienes, cycloaliphatic epoxides such as vinyl cyclohexene dioxide and bis(3,4-epoxy-6-methylcyclohexyl methyl) adipate, and the like.

As the preferred aromatic type epoxy cross-linking agents, there may be mentioned the glycidyl ethers, thioethers, and esters of aromatic compounds having an average of from about 2 to 4 hydroxy, thio, carboxy, or mixture of such groups per molecule such as, for example, diglycidyl ether of bisphenol A, diglycidyl ether of bisphenol F, diglycidyl ether of resorcin, polyglycidyl ethers of phenol novolaks, polyglycidyl ethers of cresol novolaks, diglycidyl esters of phthalic acid, and the like. Also suitable are the polyglycidyl ethers of the polyalkylene oxides of the foregoing aromatic polyglycidyl ethers and esters.

The epoxy cross-linking agent preferably has an epoxide equivalent weight of from about 90 to 6000, more preferably from about 180 to about 800, and especially from about 180 to 300.

Preferred are diepoxide cross-linkers of the group consisting of 1,4-cyclohexanedimethanol diglycidyl ether, dicyclopentadiene diepoxide, and bisphenol A diglycidyl ether.

The thermally curable polymer composition also comprises a hydroxyl-containing polymer. Any suitable hydroxyl-containing polymer may be used such as polymers comprising monomer units of cyclohexanol, hydroxystyrene, hydroxyalkyl acrylate or methacrylate, hydroxycycloalkyl acrylate, or methacrylate, hydroxyaryl acrylamide or methacrylamide, allyl alcohol and the like. This invention also contemplates copolymers, terpolymers, and the like of the foregoing named polymers. In addition, polymers containing novolaks may also be used.

Preferably, polymers comprising monomer units of cyclohexanol, hydroxystyrene hydroxyalkyl acrylate or methacrylate, hydroxycycloalkyl acrylate or methacrylate and hydroxyaryl acrylamide or methacrylamide have a number average molecular weight of about 9000 to 38,000, more preferably 14,000 to 30,000 and even more preferably about 18,000 to 22,000.

In addition, the thermally curable polymer composition may also further comprise monomer units of cycloaliphatic esters of acrylic or methacrylic acid. Suitable examples of monomer units of cycloaliphatic esters of acrylic or methacrylic acid are cyclohexyl acrylate or methacrylate, 4-tert-butylcyclohexyl acrylate or methacrylate and isobornyl acrylate or methacrylate and the like. The preferred monomer units of cycloaliphatic ester of acrylic or methacrylic acid are isobornyl acrylate or methacrylate. Furthermore, the hydroxyl-containing polymer may further comprise aromatic monomer units, preferably styrene.

Examples of suitable hydroxyalkyl acrylate or methacrylates are hydroxymethyl acrylate or methacrylate, 2-hydroxyethyl acrylate or methacrylate, 3-hydroxypropyl acrylate or methacrylate, 4-hydroxybutyl acrylate or methacrylate, 5-hydroxypentyl acrylate or methacrylate, and 6-hydroxyhexyl acrylate or methacrylate and the like. Preferably, the hydroxyalkyl acrylate or methacrylate contains primary hydroxyl groups, although secondary alcohol groups or mixtures of primary and secondary alcohol groups may be used. Suitable examples of secondary alcohols are 2-hydroxy-2-methylethyl acrylate or methacrylate, 3-hydroxy-3-methypropyl acrylate, 4-hydroxy-4-methylbutyl acrylate or methacrylate, 5-hydroxy-5-methyl propyl acrylate or methacrylate, and the like. The preferred hydroxyalkyl acrylate or methacrylate is 2-hydroxyethyl acrylate or methacrylate.

The thermally curable polymer composition may optionally contain a thermal acid generator. Generally, the thermal acid generator is needed when acid monomer units such as phenolic monomer units are not present in the hydroxyl-containing polymer. When the hydroxyl-containing polymer does not contain sufficient acid monomer units, the thermally curable polymer composition will not cure at temperatures less than about 250° C. and for a time less than about 3 minutes. Generally, if phenolic monomers units are present in an amount of at least about 10 mole % of the hydroxyl-containing polymer, the thermal acid generator is not needed. However, if the amount of phenolic monomer units is below about 10 mole %, then a thermal acid generator may be required.

Preferably, the thermal acid generator has the general formula:

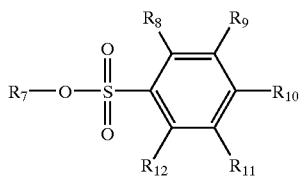

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic. More preferable thermal acid generators are cyclohexyl p-toluenesulfonate, methyl p-toluenesulfonate and cyclohexyl 2,4,6-triisopropylbenzenesulfonate. The amount of thermal acid generator in the thermally curable polymer composition is about 1 to 20 wt %, preferably about 2 to 15 wt. %, and more preferably about 4 to 10 wt. %.

The thermally curable polymer composition of the present invention should not begin significant cross-linking until it reaches a temperature of about 50° C. Significant cross-linking below 50° C. may lead to gel formation at room temperature, which will reduce its shelf life. Gel formation results in non-uniform coatings and linewidth variations across the substrate when the thermally curable polymer composition is used as an undercoat layer in microlithography.

The more preferable polymers of the present invention comprise polymers with the following monomer units:

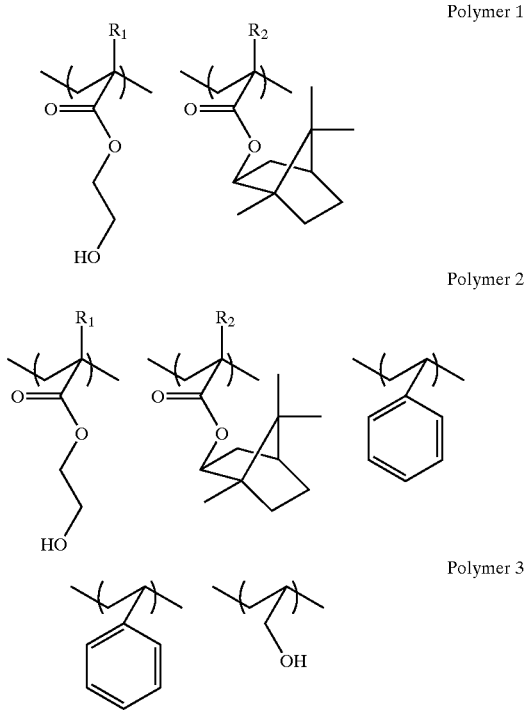

Polymer 1

Polymer 2

Polymer 3

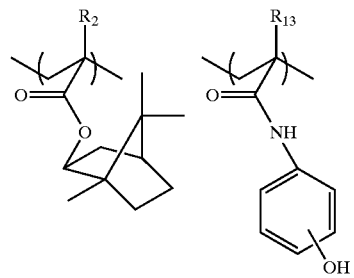

Polymer 4 wherein for each of the formulas above, $R_1$, $R_2$ and $R_{13}$ are independently selected from hydrogen or methyl.

Polymer 1 comprises about 60 to 80 mole % of isobornyl acrylate or methacrylate monomer units and about 20 to 40 mole % of 2-hydroxyethyl acrylate or methacrylate monomer units.

Polymer 2 comprises about 30 to 40 mole % of isobornyl acrylate or methacrylate monomer units, about 10 to 30 mole % of 2-hydroxyethyl acrylate or methacrylate monomer units, and about 30 to 50 mole % of styrene monomer units.

Polymer 3 comprises about 39–60 mole % of styrene monomer units and about 40 to 61 mole % of allyl alcohol monomer units. It is commercially available from Scientific Polymer Products, Inc., Ontario, N.Y.

Polymer 4 comprises about 70–90 mole % of isobornyl acrylate or methacrylate monomer units, and 10–30 mole % p-hydroxyphenyl acrylamide or methacrylamide monomer units.

The polymerization of the polymers described above may be carried out by any suitable polymerization process such as free radical polymerization. The number average molecular weight of the Polymers 1, 2 and 4 are about 9,000 to 38,000, preferably about 14,000 to 20,000 and more preferable about 18,000 to 22,000. The weight average molecular weight of polymer 3 is about 2000 to 20,000, preferably about 2,000 to 10,000 and more preferably about 2000 to 5000.

The present invention also relates to a photolithographic coated substrate comprising: a substrate, a thermally cured undercoat composition on the substrate, and a radiation-sensitive resist topcoat on the thermally cured undercoat composition. The thermally cured undercoat composition comprises the thermally curable polymer composition comprising a hydroxyl-containing polymer, a polyfunctional epoxide cross-linking agent and, optionally, a thermal acid generator that have been heated to form a cross-linked matrix. Any of the polymers described above may be used as the hydroxyl-containing polymer. Preferably, the hydroxyl-containing polymer is selected from Polymers 1, 2, 3 or 4.

The present invention further relates to a process for using the photolithographic coated substrate for the production of relief structures comprising the steps of: providing the photolithographic coated substrate, imagewise exposing the radiation-sensitive resist topcoat to actinic radiation; and forming a resist image by developing the radiation-sensitive resist topcoat with a developer to form open areas in the radiation-sensitive resist topcoat. In addition, the thermally cured undercoat composition may be removed in the open areas of the developed radiation-sensitive resist topcoat by any suitable process such as oxygen plasma etching to form an image in the thermally cured undercoat composition.

One advantage of the thermally curable polymer composition is that it may be cured at a temperature of less than about 250° C. and for a time less than about 180 seconds. This makes it particularly useful as an undercoat layer for a resist system where temperature and time constraints are important for commercial viability.

Both the undercoat and the radiation-sensitive compositions are uniformly applied to a substrate by known coating methods. The compositions are solubilized in an organic solvent and the coatings may be applied by spin-coating, dipping, knife coating, lamination, brushing, spraying, and reverse-roll coating. The coating thickness range generally covers values of about 0.1 to more than 10 μm and more preferably from about 0.1 to 1.5 um for the radiation-sensitive resist and about 0.3 to 3.0 um for the undercoat layer. After the coating operation, the solvent is generally removed by curing or drying.

Suitable solvents for the both the undercoat and top radiation-sensitive compositions include ketones, ethers and esters, such as methyl ethyl ketone, methyl isobutyl ketone, 2-heptanone, cyclopentanone, cyclehexanone, 2-methoxy-1-propylene acetate, 2-methoxyethanol, 2-ethoxyethanol, 2-ethoxyethyl acetate, 1-methoxy-2-propyl acetate, 1,2-dimethoxy ethane ethyl acetate, cellosolve acetate, propylene glycol monoethyl ether acetate, propylene glycol methyl ether acetate, methyl lactate, ethyl lactate, methyl pyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like.

The radiation-sensitive resist topcoat of the present invention may be any suitable radiation-sensitive resist. It is typically a chemically amplified resist sensitive to radiation in the deep UV region such as those referenced in U.S. Pat. Nos. 5,492,793 and 5,747,622. Preferably, for a bilayer resist system, the radiation-sensitive resist will contain silicon to protect it from oxygen plasma etching. A preferable radiation sensitive resist topcoat comprises a polymer comprising the following monomer units:

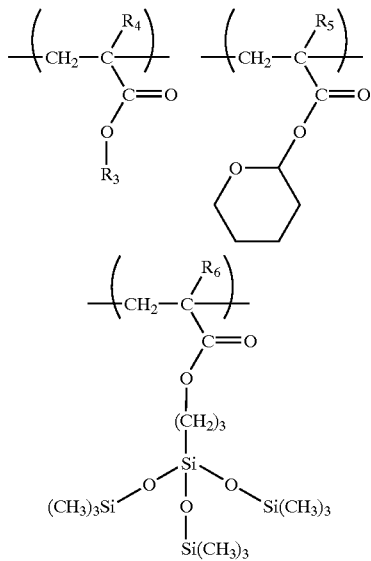

wherein $R_3$ is methyl or hydroxyethyl, $R_4$ is hydrogen, methyl or $CH_2CO_2CH_3$, and $R_5$ and $R_6$ are hydrogen or methyl, with each choice made independently.

The radiation-sensitive resist will also contain a photoacid generating (PAG) compound. The PAG compounds may be of any suitable type such as sulfonium or iodonium salts, nitrobenzyl esters, imidosulfonates esters and the like. Typically the PAG will be in an amount of about 1 to 10% based on the weight of the polymer.

For the production of relief structures, the radiation-sensitive resist is imagewise exposed to actinic radiation. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask. The imagewise exposure generates acid in the exposed regions of the resist which cleaves the acid labile groups resulting in a polymer which is aqueous soluble. Typically, after imagewise exposure, the chemically amplified resist will be subjected to a post exposure heating treatment that virtually completes the reaction of the photoacid generator with the acid labile groups.

After imagewise exposure and any heat treatment of the material, the exposed areas of the top radiation-sensitive resist are typically removed by dissolution in a aqueous developer. The choice of the particular developer depends on the type of photoresist; in particular on the nature of the polymer resin or the photolysis products generated. The developer can comprise aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

The radiation-sensitive resist used for the bilayer process described above will typically contain silicon or have silicon incorporated into the resist after development. After images are formed in the radiation-sensitive resist, the substrate will be placed in a plasma-etching environment comprising oxygen so that the underlayer coating will be removed. The silicon incorporated in the radiation-sensitive resist forms silicon dioxide when exposed to an oxygen plasma and protects it from being etched so that relief structures can be formed in the undercoat layer.

After the oxygen plasma step, the substrate carrying the bilayer relief structure is generally subjected to at least one further treatment step which changes the substrate in areas not covered by the bilayer coating. Typically, this can be implantation of a dopant, deposition of another material on the substrate or an etching of the substrate. This is usually followed by the removal of the resist coating from the substrate typically by a fluorine/oxygen plasma etch.

This invention is explained below in further detail with reference to examples, which are not by way of limitation, but by way of illustration.

EXAMPLE 1

Synthesis Procedure for Polymer 1

In a 100 ml three-necked round bottom flask equipped with a magnetic stir bar, addition funnel, condenser, and nitrogen inlet-outlet was added a mixture of 24.0 g of isobornyl methacrylate, 6.0 g of p-hydroxyphenyl methacrylamide, 30 ml of tetrahydrofuran (THF) and 0.45 g of 2,2'-azobis(2-methylbutyronitrile). The mixture was heated to 65° C. and stirred for 18 hours. The solution was precipitated by the addition of 1 liter of hexanes, and the precipitate was filtered. The solid was dried for 1 hour under a water aspirator vacuum, subsequently dissolved in 80 ml of THF and reprecipitated in 1 liter of hexanes. The precipitate was filtered, and the solid dried at 4 mbar for 24 hours. The yield of polymer was between 77–80%. Molecular weights and molecular weight distributions were measured using a Waters Corp. liquid chromatograph. The number average molecular weight was 21,933 and the polydispersity (Mw/Mn) was 3.30. Thermal decomposition measurements (TGA) were performed using a Perkin-Elmer thermal gravimetric analyzer giving a weight loss of 60% between 250–380° C. The structure and composition of polymers was analyzed using a Bruker 250 MHz NMR-spectrometer. The mole % of isobornyl methacrylate was 82.7% and the mole % of p-hydroxyphenyl methacrylamide was 17.3%.

EXAMPLE 2

Formulation Example

An 11% by weight thermally curable polymer composition was formulated by dissolving 9.96 g of Polymer 1 as prepared above and 1.04 g of 1,4-cyclohexanedimethanol diglycidyl ether in 89 g of propylene glycol methyl ether acetate (PGMEA). The mixture was rolled overnight, and the undercoat solution was filtered twice through a 0.1 micron filter.

EXAMPLE 3

Formulation Example

A 11% by weight thermally curable polymer composition was formulated by dissolving 9.96 g of Polymer 1 as prepared above and 1.42 g of dicyclopentadiene diepoxide were combined and dissolved in 89 g of PGMEA. The mixture was rolled overnight, and the undercoat solution was filtered twice through a 0.1 micron filter.

EXAMPLE 4–13

Formulation Examples

Table 1 below shows formulations of polymer 3 obtained from Scientific Polymer Products, Inc. (60 mole % styrene and 40 mole % allyl alcohol) with epoxide cross-linking agents and a thermal acid generator (cyclohexyl p-toluenesulfonate). The formulation procedure is the same as Examples 2 and 3.

TABLE 1

| Example | Polymer 3 (grams) | Cross-linking Agent (grams) | Thermal Acid Generator (grams) | PGMEA (grams) |
|---|---|---|---|---|
| 4 | 2.17 | 0.84 (DCPDE) | 0.192 | 16.8 |
| 5 | 2.52 | 0.49 (DCPDE) | 0.192 | 16.8 |
| 6 | 2.22 | 0.86 (DCPDE) | 0.128 | 16.8 |
| 7 | 1.88 | 1.13 (CDDG) | 0.192 | 16.8 |
| 8 | 2.31 | 0.70 (CDDG) | 0.192 | 16.8 |
| 9 | 1.92 | 1.15 (CDDG) | 0.128 | 16.8 |
| 10 | 2.39 | 0.92 (DCPDE) | 0.288 | 16.40 |
| 11 | 2.34 | 0.90 (DCPDE) | 0.360 | 16.40 |
| 12 | 2.07 | 1.25 (CDDG) | 0.288 | 16.40 |
| 13 | 2.02 | 1.22 (CDDG) | 0.360 | 16.40 |

DCPDE - Dicyclopentadienyl Diepoxide
CDDG - Cyclohhexanedimethanol diglycidylether

EXAMPLE 14

Preparation of Bilayer Resist

A silicon wafer was spin coated with the undercoat solution of Example 2 and baked at 250° C. for 3 min. to yield a 0.50 micron thick film. A radiation-sensitive resist topcoat was spin coated over the undercoat and baked at 100° C. for 1 min. to yield a 0.25 micron thick film. The radiation-sensitive resist topcoat was a chemically amplified resist system comprising a terpolymer of tetrahydropyranylmethacrylate/methyl methacrylate/methacryloxypropyl tris(trimethoxy)silane, a triphenylsulfonium-triflate PAG, a triphenylimidole base compound and PGMEA solvent. The coated wafer was then exposed using a 0.6 NA ISI 193 nm Microstepper. The wafer was post exposure baked at 100° C. for 1 min. and developed for 30 sec. in 0.262 N aqueous TMAH. The wafer was spun dry and the image was analyzed by scanning electron microscopy (SEM). Images from SEM showed the bilayer resist could resolve features as small as 0.14 micron. The bilayer could resolve features as small as 0.14 μm. In addition, the glass transition temperature of the undercoat was greater than 250° C., which shows that it can withstand subsequent high temperature processing. Furthermore, the oxygen plasma etch rate of the undercoat was within 15% of the etch rate of novolaks.

Repeating the procedure with the undercoat of Example 3 gave the same result.

The foregoing is illustrative of the present invention and is not construed as limiting thereof. The invention is defined by the following claims with equivalents of the claims to be included therein.

What is claimed is:

1. A thermally curable polymer composition comprising a hydroxyl-containing polymer, a polyfunctional epoxide cross-linking agent and optionally a thermal acid generator, wherein said hydroxyl-containing polymer comprises (a) at least one monomer unit selected from the group consisting of: cyclohexanol, hydroxystyrene, hydroxyalkyl acrylate or methacrylate, hydroxycycloalkyl acrylate or methacrylate, hydroxyaryl acrylamide or methacrylamide, and allyl alcohol and (b) a monomer unit of a cycloaliphatic ester of acrylic acid or methacrylic acid; provided that when a phenolic monomer is not present in an amount of at least about 10 mole % of said hydroxyl-containing polymer, said thermal acid generator is present and wherein the thermal acid generator has the general structure:

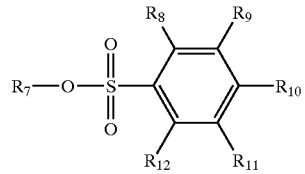

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic.

2. The composition of claim 1 wherein the polyfunctional epoxide has the general structure:

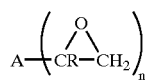

wherein A is a polyvalent group with a valence of at least 2, n is a integer of at least 2 and R is a hydrogen or a hydrocarbyl radical.

3. The composition of claim 1 wherein said hydroxyl containing polymer comprising one monomer unit of allyl alcohol has a polymer weight average molecular weight of about 2000 to 10,000 and wherein said polymer comprising monomer units of cyclohexanol, hydroxyalkyl acrylate or methacrylate, hydroxycycloalkyl acrylate or methacrylate and hydroxyaryl acrylamide or methacrylamide has a number average molecular weight of about 9,000 to 38,000.

4. A thermally curable polymer composition comprising a hydroxyl-containing polymer, a polyfunctional epoxide cross-linking agent and optionally a thermal acid generator, wherein said hydroxyl-containing polymer comprises at least one monomer unit selected from the group consisting of: cyclohexanol, hydroxystyrene, hydroxyalkyl acrylate or methacrylate, hydroxycycloalkyl acrylate or methacrylate, hydroxyaryl acrylamide or methacrylamide, and allyl alcohol; provided that when a phenolic monomer unit is not present in the hydroxyl-containing polymer in an amount of at least about 10 mole % of said hydroxyl-containing polymer, said thermal acid generator is present, and wherein said hydroxyl-containing polymer comprises the following monomer units:

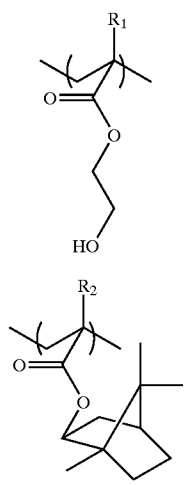

wherein $R_1$ and $R_2$ are independently a hydrogen or a methyl.

5. The composition of claim 4 wherein the mole % of monomer unit (A) is about 20 to 40 mole % and the mole % of monomer unit (B) is about 60 to 80 mole %.

6. A thermally curable polymer composition comprising a hydroxyl-containing polymer, a polyfunctional epoxide cross-linking agent and optionally a thermal acid generator, wherein said hydroxyl-containing polymer comprises at least one monomer unit selected from the group consisting of: cyclohexanol, hydroxystyrene, hydroxyalkyl acrylate or methacrylate, hydroxycycloalkyl acrylate or methacrylate, hydroxyaryl acrylamide or methacrylamide, and allyl alcohol; provided that when a phenolic monomer unit is not present in the hydroxyl-containing polymer in an amount of at least about 10 mole % of said hydroxyl-containing polymer, said thermal acid generator is present, and wherein said hydroxyl-containing polymer comprises the following monomer units:

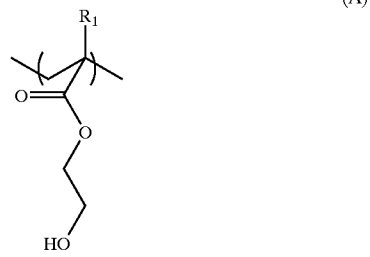

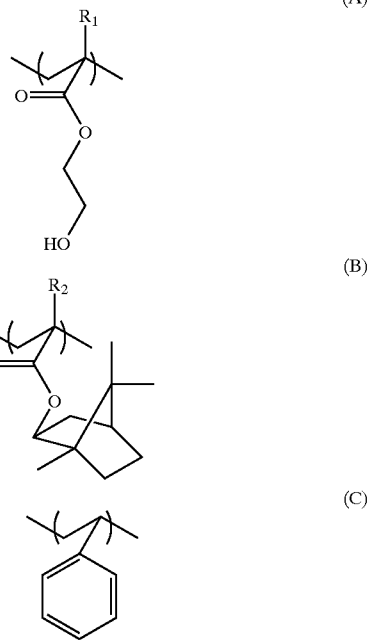

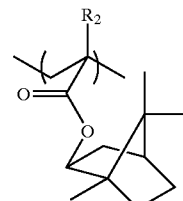

wherein $R_1$ and $R_2$ are independently a hydrogen or a methyl.

7. The composition of claim 6 wherein the mole % of monomer unit (A) is about 10 to 30 mole %, the mole % of monomer unit (B) is about 30 to 40 mole % and the mole % of monomer unit (C) is about 30 to 50 mole %.

8. A thermally curable polymer composition comprising a hydroxyl-containing polymer, a polyfunctional epoxide cross-linking agent and optionally a thermal acid generator, wherein said hydroxyl-containing polymer comprises at least one monomer unit selected from the group consisting of: cyclohexanol, hydroxystyrene, hydroxyalkyl acrylate or methacrylate, hydroxycycloalkyl acrylate or methacrylate, hydroxyaryl acrylamide or methacrylamide, and allyl alcohol; provided that when a phenolic monomer unit is not present in the hydroxyl-containing polymer in an amount of at least about 10 mole % of said hydroxyl-containing polymer, said thermal acid generator is present, and wherein said hydroxyl-containing polymer comprises the following monomer units:

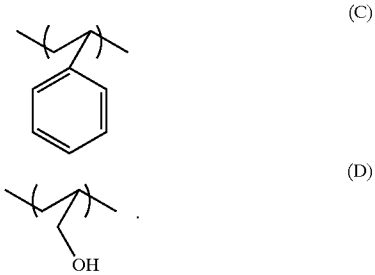

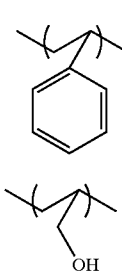

9. The composition of claim 8 wherein the mole % of monomer unit (C) is about 39–60 mole % and the mole % of monomer unit (D) is about 40 to 61 mole %.

10. A thermally curable polymer composition comprising a hydroxyl-containing polymer, a polyfunctional epoxide cross-linking agent and optionally a thermal acid generator, wherein said hydroxyl-containing polymer comprises at least one monomer unit selected from the group consisting of: cyclohexanol, hydroxystyrene, hydroxyalkyl acrylate or methacrylate, hydroxycycloalkyl acrylate or methacrylate, hydroxyaryl acrylamide or methacrylamide, and allyl alcohol; provided that when a phenolic monomer unit is not present in the hydroxyl-containing polymer in an amount of at least about 10 mole % of said hydroxyl-containing polymer, said thermal acid generator is present, and wherein said hydroxyl-containing polymer comprises the following monomer units:

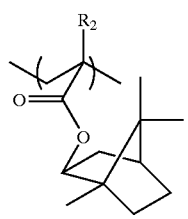
(B)

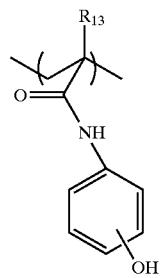
(E)

wherein $R_2$ and $R_{13}$ are independently a hydrogen or a methyl.

11. The composition of claim 10 wherein the mole % of monomer unit (B) is 70–90% and the mole % of monomer unit (B) is 10–30%.

12. A photolithographic sensitive coated substrate comprising:

(a) a substrate;

(b) a thermally cured undercoat on the substrate; and (c) a radiation-sensitive resist topcoat disposed on said thermally cured undercoat;

wherein said thermally cured undercoat comprises a thermally cured composition comprising:

a hydroxyl-containing polymer comprising the following monomer units:

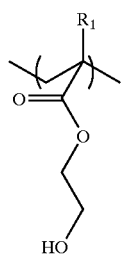
(A)

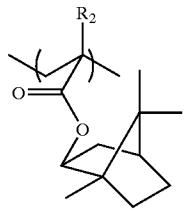
(B)

wherein $R_1$ and $R_2$ are independently a hydrogen or a methyl;

a polyfunctional epoxide cross-linking agent; and optionally a thermal acid generator, provided that when a phenolic monomer is not present in the hydroxyl-containing polymer in an amount of at least about 10 mole % of said hydroxyl-containing polymer, said thermal acid generator is present, and wherein the thermal acid generator has the general structure:

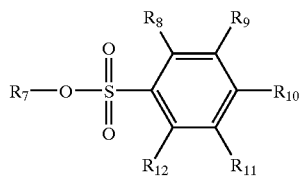

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic.

13. The coated substrate of claim 12 wherein the polyfunctional epoxide has the general structure:

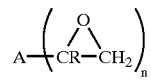

wherein A is a polyvalent group with a valence of at least 2, n is a integer of at least 2 and R is a hydrogen or a hydrocarbyl radical.

14. The coated substrate of claim 12 wherein the mole % of monomer unit (A) is about 20 to 40 mole % and the mole % of monomer unit (B) is about 60 to 80 mole %.

15. The coated substrate of claim 12 wherein said radiation-sensitive resist topcoat is a chemically amplified resist containing silicon.

16. The coated substrate of claim 15 wherein said wherein the radiation sensitive topcoat comprises a polymer comprising the following monomer units:

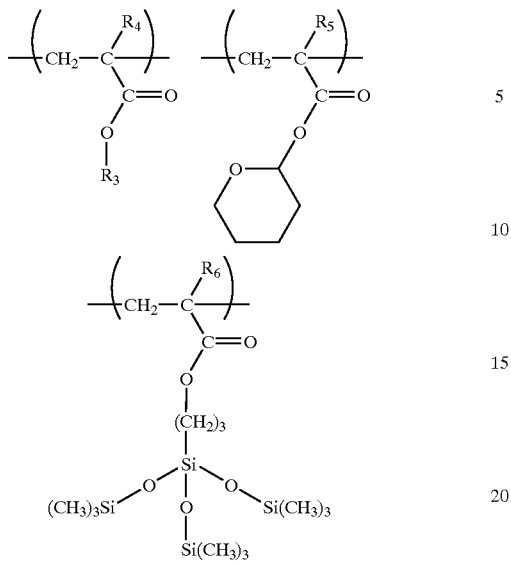

wherein $R_3$ is methyl or hydroxyethyl, $R_4$ is hydrogen, methyl or $CH_2CO_2CH_3$ and $R_5$ and $R_6$ are hydrogen or methyl, with each choice made independently.

17. A photolithographic sensitive coated substrate comprising:
(a) a substrate;
(b) a thermally cured undercoat on the substrate; and
(c) a radiation-sensitive resist topcoat disposed on said thermally cured undercoat;

wherein said thermally cured undercoat comprises a thermally cured composition comprising a hydroxyl-containing polymer, a polyfunctional epoxide cross-linking agent and optionally a thermal acid generator, provided that when a phenolic monomer is not present in the hydroxyl-containing polymer in an amount of at least about 10 mole % of said hydroxyl-containing polymer, said thermal acid generator is present wherein the hydroxyl-containing polymer comprises (i) monomer units selected from the group consisting of: cyclohexanol, hydroxystyrene, hydroxyalkyl acrylate or methacrylate, hydroxycycloalkyl acrylate or methacrylate, hydroxyaryl acrylamide or methacrylamide, and allyl alcohol and (ii) monomer units of cycloaliphatic ester of acrylic acid or methacrylic acid units.

18. The coated substrate of claim 17 wherein said polyfunctional epoxide cross-linking agent is selected from the group consisting of: 1,4-cyclohexanedimethanol diglycidyl ether, dicyclopentadiene diepoxide, and bisphenol A diglycidyl ether; and said thermal acid generators is selected from the group consisting of: cyclohexyl p-toluenesulfonate, methyl p-toluenesulfonate and cyclohexyl 2,4,6-triisopropylbenzenesulfonate.

19. A photolithographic sensitive coated substrate comprising:
(a) a substrate;
(b) a thermally cured undercoat on the substrate; and
(c) a radiation-sensitive resist topcoat disposed on said thermally cured undercoat;

wherein said thermally cured undercoat comprises a thermally cured composition comprising:
a hydroxyl-containing polymer comprising the following monomer units:

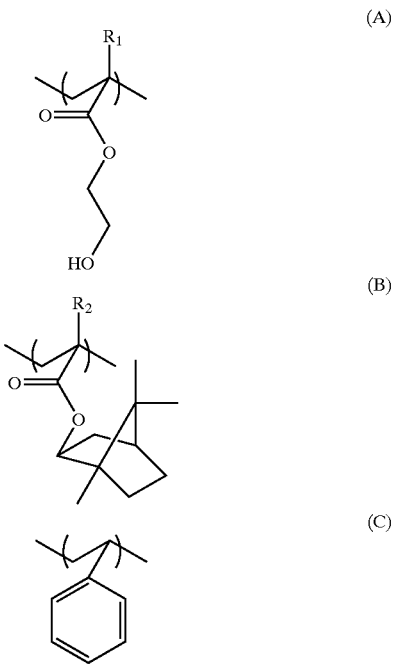

wherein $R_1$ and $R_2$ are independently a hydrogen or a methyl;
a polyfunctional epoxide cross-linking agent; and
optionally a thermal acid generator, provided that when a phenolic monomer is not present in the hydroxyl-containing polymer in an amount of at least about 10 mole % of said hydroxyl-containing polymer, said thermal acid generator is present, and wherein the thermal acid generator has the general structure:

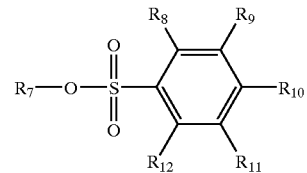

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic.

20. The coated substrate of claim 19 wherein the mole % of monomer unit (A) is about 10 to 30 mole %, the mole % of monomer unit (B) is about 30 to 40 mole % and the mole % of monomer unit (C) is about 30 to 50 mole %.

21. A photolithographic sensitive coated substrate comprising:
(a) a substrate;
(b) a thermally cured undercoat on the substrate; and
(c) a radiation-sensitive resist topcoat disposed on said thermally cured undercoat;

wherein said thermally cured undercoat comprises a thermally cured composition comprising:

a hydroxyl-containing polymer comprising the following monomer units:

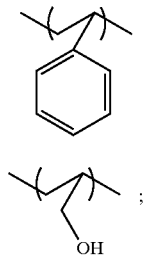
(C)

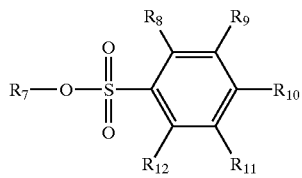
(D)

a polyfunctional epoxide cross-linking agent; and optionally a thermal acid generator, provided that when a phenolic monomer is not present in the hydroxyl-containing polymer in an amount of at least about 10 mole % of said hydroxyl-containing polymer, said thermal acid generator is present, and wherein the thermal acid generator has the general structure:

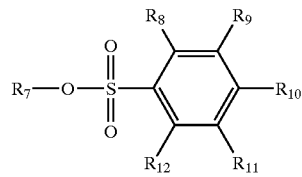

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic.

22. The coated substrate of claim 21 wherein the mole % of monomer unit (C) is about 39–60 mole % and the mole % of monomer unit (D) is about 40 to 61 mole %.

23. A photolithographic sensitive coated substrate comprising:
(a) a substrate;
(b) a thermally cured undercoat on the substrate; and
(c) a radiation-sensitive resist topcoat disposed on said thermally cured undercoat;
wherein said thermally cured undercoat comprises a thermally cured composition comprising:
a hydroxyl-containing polymer comprising the following monomer units:

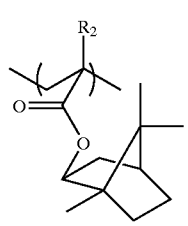
(B)

-continued

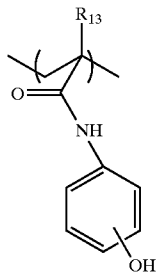
(E)

wherein $R_2$ and $R_{13}$ are independently a hydrogen or a methyl;
a polyfunctional epoxide cross-linking agent; and
optionally a thermal acid generator, provided that when a phenolic monomer is not present in the hydroxyl-containing polymer in an amount of at least about 10 mole % of said hydroxyl-containing polymer, said thermal acid generator is present, and wherein the thermal acid generator has the general structure:

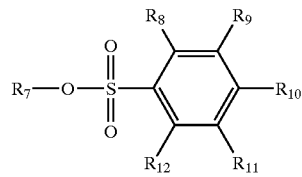

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic.

24. The coated substrate of 23 wherein the mole % of monomer unit (B) is 10–30% and mole % of monomer unit (E) is 70–90%.

25. A process for the production of relief structures comprising the steps of:
(a) providing a coated substrate; wherein said coated substrate comprises a substrate; a thermally cured undercoat on the substrate; and a radiation-sensitive resist topcoat on the thermally cured undercoat; and wherein said thermally cured undercoat comprises a thermally cured composition comprising a hydroxyl-containing polymer having (i) monomer units selected from the group consisting of: cyclohexanol, hydroxystyrene, hydroxyalkyl acrylate or methacrylate, hydroxycycloalkyl acrylate or methacrylate, hydroxyaryl acrylamide or methacrylamide, and allyl alcohol and (ii) monomer units of cycloaliphatic ester of acrylic acid or methacrylic acid units, a polyfunctional epoxide cross-linking agent and optionally a thermal acid generator; provided that when a phenolic monomer unit is not present in the hydroxyl-containing polymer in an amount of at least about 10 mole % of said hydroxyl-containing polymer, said thermal acid generator is present, and wherein the thermal acid generator has the general structure:

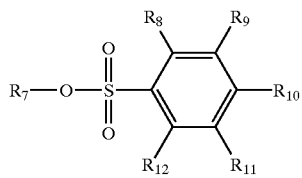

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic;

(b) imagewise exposing the radiation-sensitive resist topcoat to actinic radiation; and (c) forming a resist image by developing the radiation-sensitive resist topcoat with a developer.

26. The process of claim 25 wherein the polyfunctional epoxide has the general structure:

wherein A is a polyvalent group with a valence of at least 2, n is a integer of at least 2 and R is a hydrogen or a hydrocarbyl radical.

27. The process of claim 25 wherein said polyfunctional epoxide cross-linking agent is selected from the group consisting of: 1,4-cyclohexanedimethanol diglycidyl ether, dicyclopentadiene diepoxide, and bisphenol A diglycidyl ether; and said thermal acid generators is selected from the group consisting of: cyclohexyl p-toluenesulfonate, methyl p-toluenesulfonate and cyclohexyl 2,4,6-triisopropylbenzenesulfonate.

28. The process of claim 25 wherein said radiation sensitive resist topcoat comprises a polymer comprising the following monomer units:

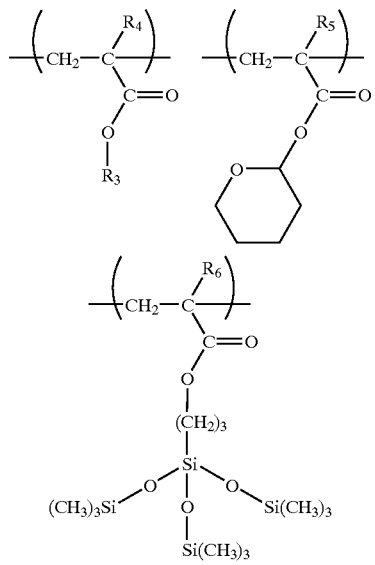

wherein $R_3$ is methyl or hydroxyethyl, $R_4$ hydrogen, methyl or $CH_2CO_2CH_3$ and $R_5$ and $R_6$ are hydrogen or methyl, with each choice made independently.

29. The process of claim 28 further comprising the step of:

removing the thermally cured undercoat composition to form an image thereof.

30. A process for the production of relief structures comprising the steps of:

(a) providing a coated substrate; wherein said coated substrate comprises a substrate; a thermally cured undercoat on the substrate; and a radiation-sensitive resist topcoat on the thermally cured undercoat; and wherein said thermally cured undercoat comprises a thermally cured composition comprising a hydroxyl-containing polymer having about 20 to 40 mole % of 2-hydroxyethyl acrylate or methacrylate monomer units and 60 to 80 mole % of isobornyl acrylate or methacrylate monomer units, a polyfunctional epoxide cross-linking agent and optionally a thermal acid generator; provided that when a phenolic monomer unit is not present in the hydroxyl-containing polymer in an amount of at least about 10 mole % of said hydroxyl-containing polymer, said thermal acid generator is present, and wherein the thermal acid generator has the general structure:

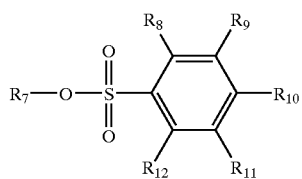

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic;

(b) imagewise exposing the radiation-sensitive resist topcoat to actinic radiation; and (c) forming a resist image by developing the radiation-sensitive resist topcoat with a developer.

31. A process for the production of relief structures comprising the steps of:

(a) providing a coated substrate; wherein said coated substrate comprises a substrate; a thermally cured undercoat on the substrate; and a radiation-sensitive resist topcoat on the thermally cured undercoat; and wherein said thermally cured undercoat comprises a thermally cured composition comprising a hydroxyl-containing polymer having about 10 to 30 mole % of 2-hydroxyethyl acrylate or methacrylate monomer units, about 30 to 40 mole % of isobornyl acrylate or methacrylate monomer units, and about 30 to 50 mole % styrene monomer units, a polyfunctional epoxide cross-linking agent and optionally a thermal acid generator; provided that when a phenolic monomer unit is not present in the hydroxyl-containing polymer in an amount of at least about 10 mole % of said hydroxyl-containing polymer, said thermal acid generator is present, and wherein the thermal acid generator has the general structure:

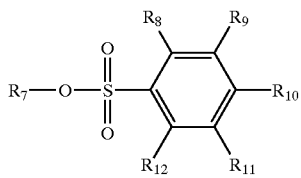

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic;

(b) imagewise exposing the radiation-sensitive resist topcoat to actinic radiation; and (c) forming a resist image by developing the radiation-sensitive resist topcoat with a developer.

32. A process for the production of relief structures comprising the steps of:

(a) providing a coated substrate; wherein said coated substrate comprises a substrate; a thermally cured undercoat on the substrate; and a radiation-sensitive resist topcoat on the thermally cured undercoat; and wherein said thermally cured undercoat comprises a thermally cured composition comprising a hydroxyl-containing polymer having about 39 to 60 mole % of styrene monomer units and about 40 to 61 mole % of allyl alcohol monomer units, a polyfunctional epoxide cross-linking agent and optionally a thermal acid generator; provided that when a phenolic monomer unit is not present in the hydroxyl-containing polymer in an amount of at least about 10 mole % of said hydroxyl-containing polymer, said thermal acid generator is present, and wherein the thermal acid generator has the general structure:

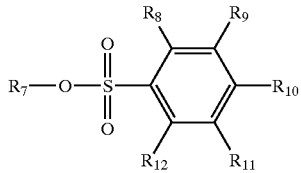

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic;

(b) imagewise exposing the radiation-sensitive resist topcoat to actinic radiation; and (c) forming a resist image by developing the radiation-sensitive resist topcoat with a developer.

33. A process for the production of relief structures comprising the steps of:

(a) providing a coated substrate; wherein said coated substrate comprises a substrate; a thermally cured undercoat on the substrate; and a radiation-sensitive resist topcoat on the thermally cured undercoat; and wherein said thermally cured undercoat comprises a thermally cured composition comprising a hydroxyl-containing polymer having about 10 to 30 mole % p-hydroxylphenyl acrylamide or methacrylamide monomer units and 70 to 90 mole % isobomyl acrylate or methacrylate monomer units, a polyfunctional epoxide cross-linking agent and optionally a thermal acid generator; provided that when a phenolic monomer unit is not present in the hydroxyl-containing polymer in an amount of at least about 10 mole % of said hydroxyl-containing polymer, said thermal acid generator is present, and wherein the thermal acid generator has the general structure:

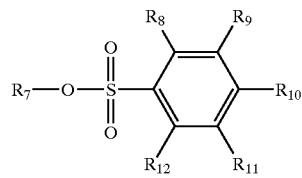

where $R_7$ is a substituted or unsubstituted alkyl, cycloalkyl or aromatic group wherein the substituted group is a halogen, alkoxy, aromatic, nitro or amino group; and $R_8$ to $R_{12}$ are independently selected from a hydrogen, a linear or branched $C_1$ to $C_4$ alkyl, an alkoxy, an amino, an alkylamino, an aryl, an alkenyl, a halogen, an acyloxy, a cycloalkyl, or an annulated cycloalkyl, aromatic or heterocyclic;

(b) imagewise exposing the radiation-sensitive resist topcoat to actinic radiation; and (c) forming a resist image by developing the radiation-sensitive resist topcoat with a developer.

* * * * *